US007145802B2

(12) United States Patent
Shone et al.

(10) Patent No.: US 7,145,802 B2
(45) Date of Patent: Dec. 5, 2006

(54) PROGRAMMING AND MANUFACTURING METHOD FOR SPLIT GATE MEMORY CELL

(75) Inventors: Fuja Shone, Hsinchu (CN); I-Long Lee, Hsinchu (CN); Yi-Ching Liu, Hsinchu (CN); Hsin-Chien Chen, Hsinchu (CN); Wen-Lin Chang, Hsinchu (CN)

(73) Assignee: Skymedi Corporation, Hsinchu (TW)

( * ) Notice: Subject to any disclaimer, the term of this patent is extended or adjusted under 35 U.S.C. 154(b) by 10 days.

(21) Appl. No.: 10/929,682

(22) Filed: Aug. 31, 2004

(65) Prior Publication Data

US 2006/0044876 A1 Mar. 2, 2006

(51) Int. Cl.
 *G11C 11/34* (2006.01)
(52) U.S. Cl. .................... 365/185.18; 365/185.05; 365/185.1; 365/185.24; 365/185.26; 365/185.28
(58) Field of Classification Search ........... 365/185.18, 365/185.05, 185.1, 185.24, 185.26, 185.28
See application file for complete search history.

(56) References Cited

U.S. PATENT DOCUMENTS

| | | | | |
|---|---|---|---|---|
| 5,422,504 A * | 6/1995 | Chang et al. | ......... | 365/185.15 |
| 5,494,838 A * | 2/1996 | Chang et al. | ......... | 438/264 |
| 5,587,332 A * | 12/1996 | Chang et al. | ......... | 438/258 |
| 5,614,747 A * | 3/1997 | Ahn et al. | ......... | 257/316 |
| 5,668,757 A * | 9/1997 | Jeng | ......... | 365/185.1 |
| 5,910,912 A * | 6/1999 | Hsu et al. | ......... | 365/185.01 |
| 6,057,575 A * | 5/2000 | Jenq | ......... | 257/319 |
| 6,060,356 A * | 5/2000 | Lee | ......... | 438/257 |
| 6,091,633 A * | 7/2000 | Cernea et al. | ......... | 365/185.13 |
| 6,107,141 A * | 8/2000 | Hsu et al. | ......... | 438/267 |
| 6,229,176 B1 * | 5/2001 | Hsieh et al. | ......... | 257/316 |
| 6,232,180 B1 * | 5/2001 | Chen | ......... | 438/257 |
| 6,420,231 B1 * | 7/2002 | Harari et al. | ......... | 438/257 |
| 6,518,619 B1 * | 2/2003 | Verhaar et al. | ......... | 257/316 |
| 6,567,315 B1 | 5/2003 | Takase et al. | | |
| 6,653,183 B1 * | 11/2003 | Hung et al. | ......... | 438/211 |
| 6,917,070 B1 * | 7/2005 | Hung et al. | ......... | 257/315 |
| 6,972,997 B1 * | 12/2005 | Ishimaru et al. | ......... | 365/185.29 |

OTHER PUBLICATIONS

Sasago et al. "10-MB/S Multi-level Programming of GB-Scale Flash Memory Enabled by New AG-and Cell Technology," 2002 IEEE.
Yamauchi et al. "A Novel Source-Side Injection Split-Gate Flash Cell Technology for High Density Low Voltage Applications," Extended Abstracts of the 1994 International Conference on Solid State Devices and Materials, Yokohama, 1994, pp. 910-912.

* cited by examiner

*Primary Examiner*—Viet Q. Nguyen
(74) *Attorney, Agent, or Firm*—Oliff & Berridge, PLC

(57) ABSTRACT

A method for programming a split gate memory cell comprises the following steps. First, a split gate memory cell formed on a semiconductor substrate of a first conductive type, e.g., p-type, is provided. The split gate memory cell has two bitlines of a second conductive type, e.g., n-type, a select gate, a floating gate, a wordline and a dielectric layer deposited between the floating gate and the semiconductor substrate, wherein the select gate and floating gate are transversely disposed between the two bitlines, the wordline is above the select gate and floating gate. Second, a positive voltage is applied to the wordline so as to turn on the floating gate, and a negative voltage is applied to the bitline next to the floating gate, whereby a bias voltage across the tunnel dielectric layer is generated for programming, that is, the so called F-N programming.

6 Claims, 10 Drawing Sheets

PROGRAMMING AND MANUFACTURING METHOD FOR SPLIT GATE MEMORY CELL

BACKGROUND OF THE INVENTION (A) Field of the Invention

The present invention is related to a programming method and a manufacturing method for non-volatile memory, and more particularly to a programming method and a manufacturing method for split gate memory.

(B) Description of the Related Art

Non-volatile memory devices are currently in wide use in electronic components that require the retention of information when electrical power is terminated. Non-volatile memory devices include read only memory (ROM), programmable read only memory (PROM), erasable programmable read only memory (EPROM) and electrically erasable programmable read only memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Typically, an EEPROM device includes a floating-gate electrode upon which electrical charge is stored. In a flash EEPROM device, electrons are transferred to a floating-gate electrode through a dielectric layer overlying the channel region of the transistor. The electron transfer is initiated by either hot electron injection or Fowler-Nordheim (F-N) tunneling.

In IEDM Conference 2002, Y. Sasago et al. disclosed a formation process of a split gate memory as shown in FIGS. 1(a) through 1(e), wherein U-shaped floating gates are used for reducing threshold voltage (Vth) shift. In FIG. 1(a), a gate oxide layer 11, a polysilicon layer 12 and a silicon oxide layer 13 are sequentially formed on a silicon substrate 10, and patterned by lithography and etching processes to form separated lines. In FIG. 1(b), oxide spacers 14 are formed by oxide deposition and etching, or thermal growth. Then, dopants such as arsenic ions are implanted with a tilted angle to form n+ regions 15. In FIG. 1(c), because doped silicon usually has a relatively high oxide growth rate in comparison with that of undoped silicon, a tunnel oxide layer 16 with a thicker portion 17 on the n+ regions 15 can be formed by thermal growth. Then, a polysilicon layer 18 is deposited, and polymer plugs 19 are deposited in the spaces between the polysilicon lines 12 as etch-back masks. In FIG. 1(d), the polysilicon layer 18 is etch-backed to be separated floating gates. In FIG. 1(e), the polymer plugs 19 are removed, and then an oxide/nitride/oxide (ONO) layer 20 and a polysilicon layer 21 are deposited. Then, the polysilicon layer 21 is patterned to be separated wordlines, i.e., control gates. Accordingly, in addition to the polysilicon layers 18 and polysilicon layer 21 function as floating gates and control gate respectively, the polysilicon lines 12 serve as select gates.

Referring to FIG. 2, U.S. Pat. No. 6,567,315 disclosed an operation method for a split gate memory cell, which can be applied to the memory cells disclosed by Sasago et al. Accordingly, the polysilicon layers 12, 18 and 21 described above are denoted by SG, FG and CG, and doping regions 15 act as source (S) and drain (D). Voltages of approximately 14V, 5V and 0.6V are applied to the control gate CG, drain D and select gate SG respectively, and source S is grounded. Consequently, a depletion region is formed within the substrate and a drain current is generated thereby, and therefore hot electrons generated when a drain current flows from the source side to the drain side are injected into the floating gate FG for programming, that is, the so-called hot electron programming.

Moreover, Yamauchi et al. disclosed a process for forming a split gate memory cell in the International Conference on Solid State Devices Materials, Yokohama, 1994. In FIG. 3(a), gate structures with a tunnel oxide layer 301, a floating gate 302, an ONO layer 303, a control gate 304 and a silicon dioxide layer 305 are formed on a substrate 30, and photoresist 306 is patterned to cap a portion of the substrate 30. Then, the substrate 30 uncovered by the photoresist 306 is implanted by dopants such as arsenic ions, so as to form a drain region 307. In FIG. 3(b), the photoresist 306 is stripped, a polysilicon layer 309 is deposited, and then silicon oxide spacers 310 are formed. Sequentially, another implantation is conducted to form source region 311. In FIG. 3(c), a tungsten silicide layer 312 is deposited after the silicon oxide spacers 310 are removed, and then the tungsten silicide layer 312 is etched to define the select gate.

Apparently, the above prior art references are either complex processes or limited to the operation by hot electron programming, so that an alternative process and operation method are needed to enhance the production efficiency and obtain better operation flexibility.

SUMMARY OF THE INVENTIION

The objective of the present invention is to provide alternative programming method and manufacturing method for split gate memory cells, so as to simplify the process and obtain more flexible operation manner.

To achieve the above objective, a method for programming a split gate memory cell is disclosed. First, a split gate memory cell formed on a semiconductor substrate of a first conductive type, e.g., p-type, is provided. The split gate memory cell has two bitlines of a second conductive type, e.g., n-type, a select gate, a floating gate, a wordline and a tunnel dielectric layer deposited between the floating gate and the semiconductor substrate, wherein the select gate and floating gate are transversely disposed between the two bitlines, and the wordline is above the select gate and floating gate. Second, a positive voltage is applied to the wordline so as to turn on the floating gate, and a negative voltage is applied to the bitline next to the floating gate, whereby a bias voltage across the tunnel dielectric layer is generated for programming, that is, the so-called F-N programming.

The above programming method can be well operated in the memory cell manufactured by the following steps. First, a semiconductor substrate comprising two doping regions is provided, and a first conductive line, e.g., a polysilicon line, is formed above the semiconductor substrate. Second, a first dielectric layer is thermally grown on the doping region and the semiconductor substrate, wherein the portion of the first dielectric layer on the doping region is thicker than that on the substrate. Then, a second conductive line is formed on the first dielectric layer. Third, a second dielectric layer, e.g., an ONO layer, is formed above the first and second conductive lines, and a third conductive line serving as a wordline is formed on the second dielectric layer. The first conductive line serves as a floating gate or a select gate, whereas the second conductive line serves as the other one, i.e., the first and second conductive lines serve as a floating gate and select gate respectively, or in contrast the first and second conductive lines serve as a select gate and a floating gate respectively. The first or second conductive line serving as select gate is provided with an insulating layer composed of, for example, silicon oxide or silicon nitride, thereon, and a dielectric spacer is formed between the first and second conductive lines.

The method of the present invention uses F-N programming instead of hot electron programming. It provides an alternative operation method so that the more flexible operation for split memory cells can be attained.

DETAILED DESCRIPTION OF THE INVENTION

Embodiments of the present invention are now being described with reference to the accompanying drawings.

FIGS. 4(a) through 4(f) illustrate a process for forming split gate memory cells of the first embodiment in accordance with the present invention.

Figure 1A:
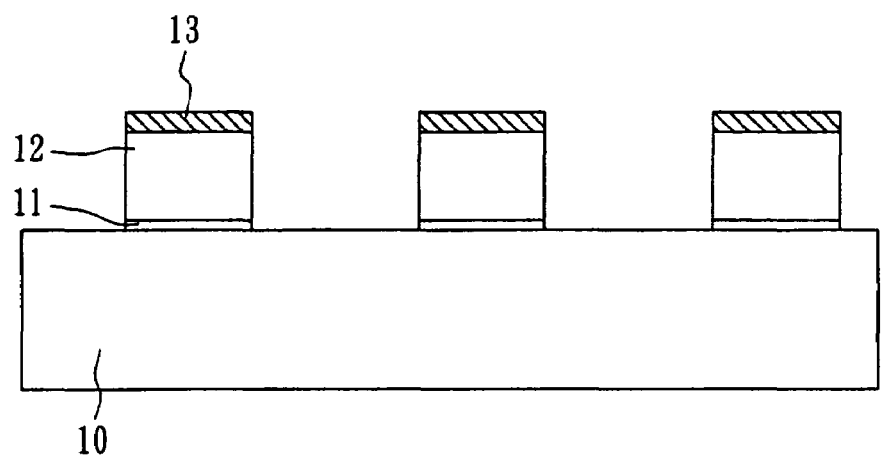
FIGS. 1(a) through 1(e) illustrate a known process for manufacturing split gate memory cells.
Figure 1B:
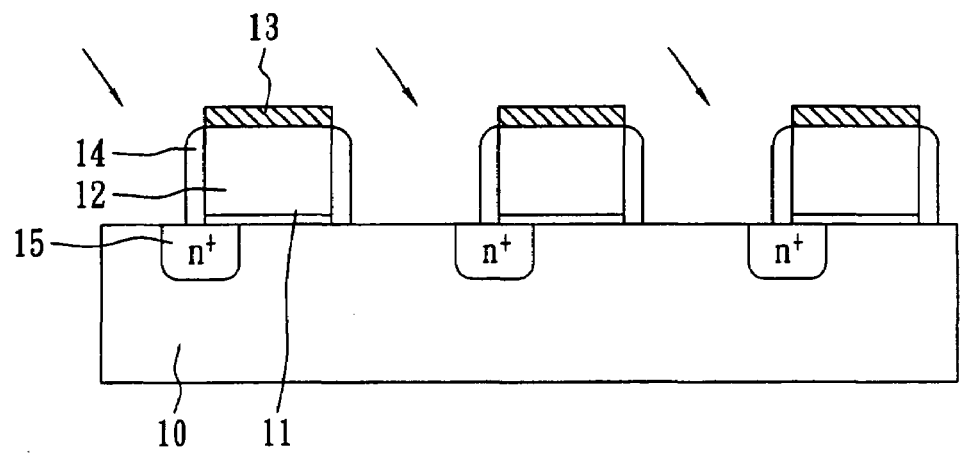
Figure 1C:
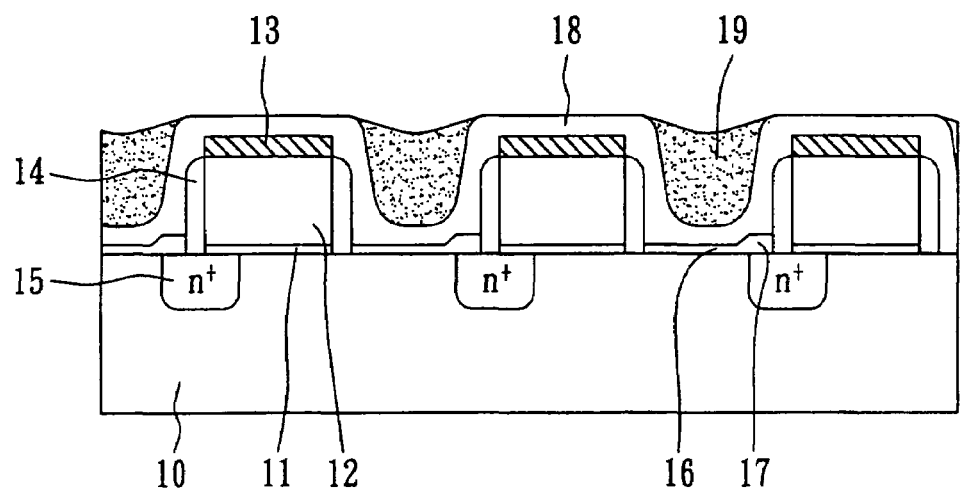
Figure 1D:
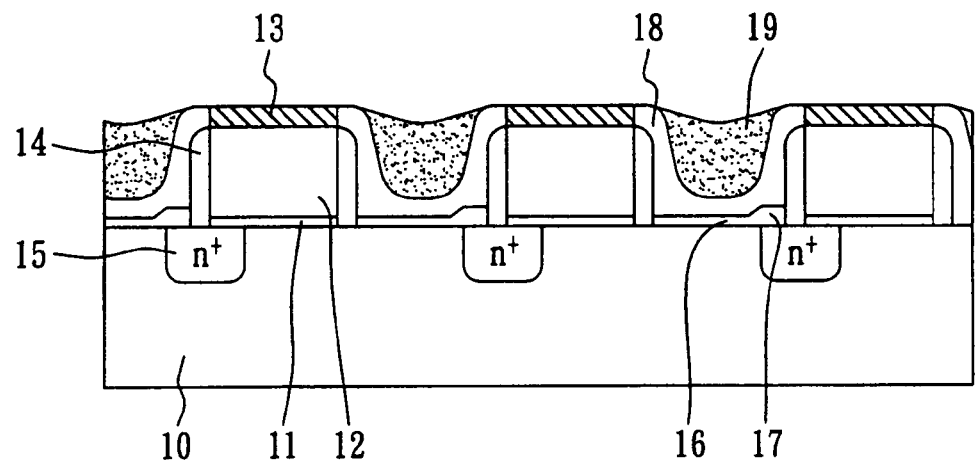
Figure 1E:
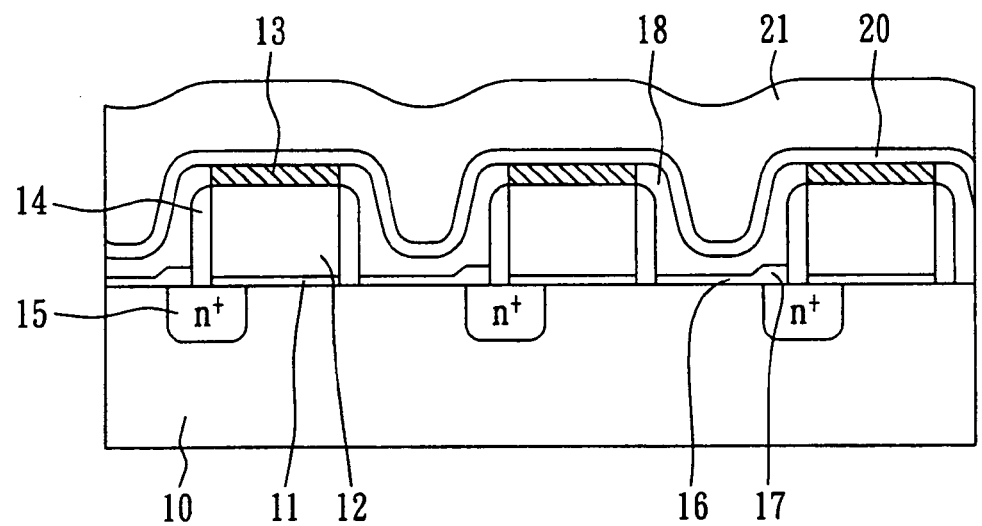
Figure 2:
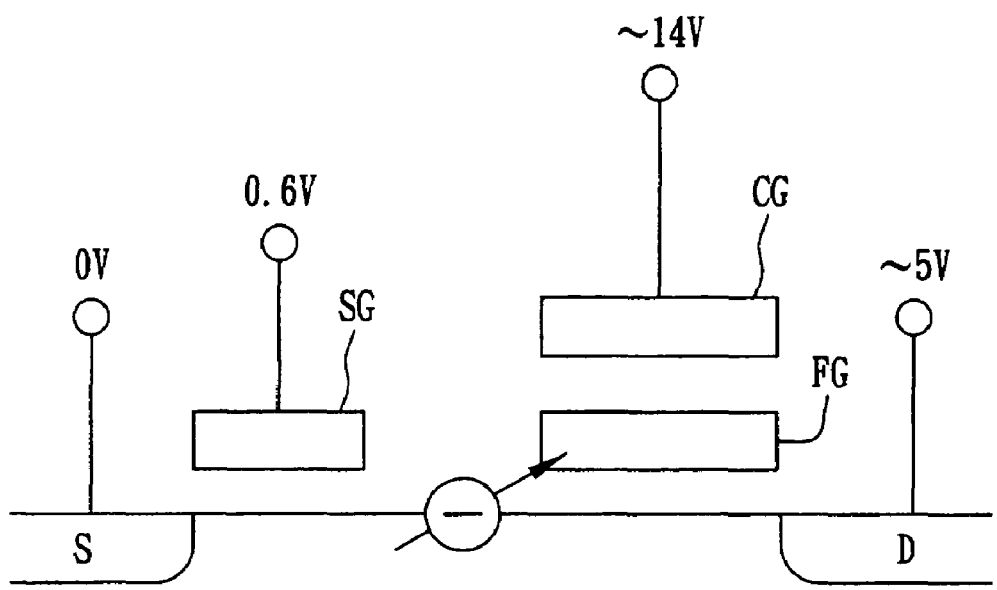
FIG. 2 illustrates a known hot electron programming method for a split gate memory cell.
Figure 3A:
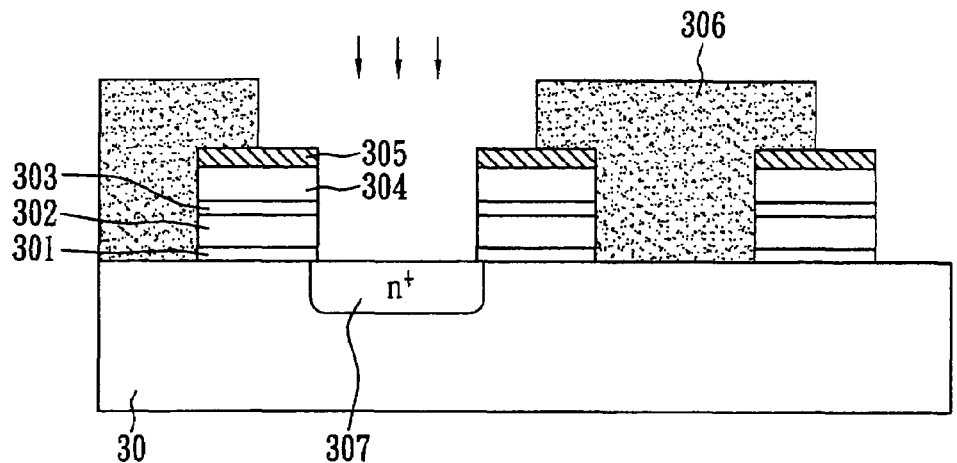
FIGS. 3(a) through 3(c) illustrate another known process for manufacturing split gate memory cells.
Figure 3B:
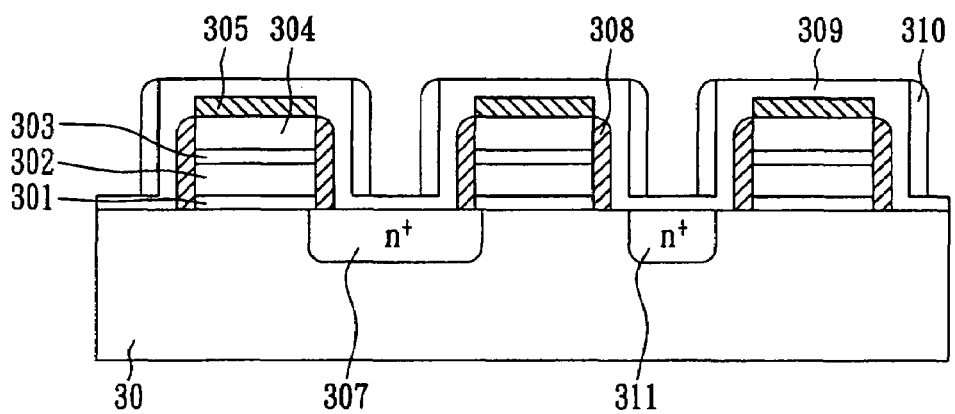
Figure 3C:
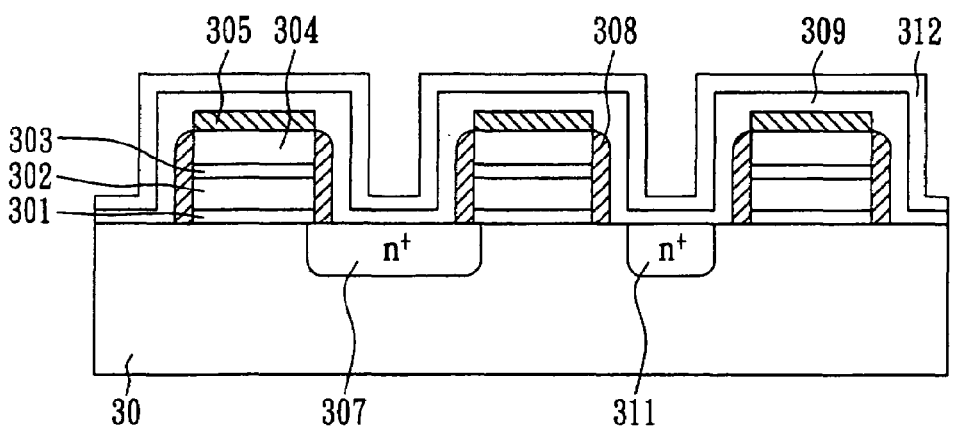
Figure 4A:
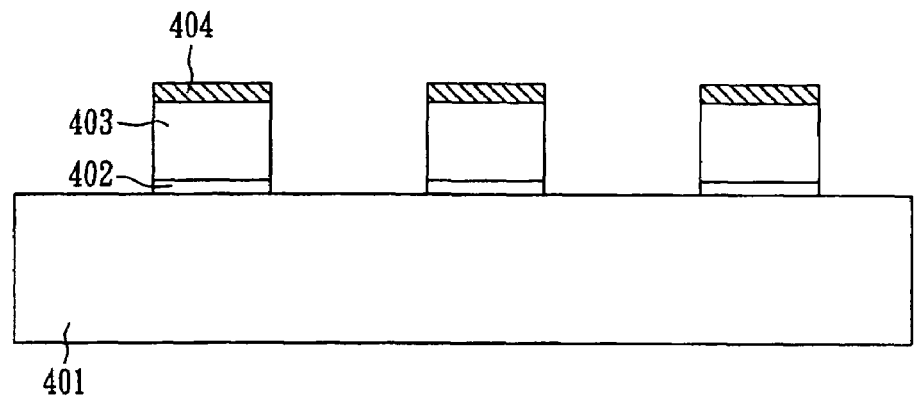
FIGS. 4(a) through 4(f) illustrate the method for manufacturing split gate memory cells of the first embodiment in accordance with the present invention.
Figure 4B:
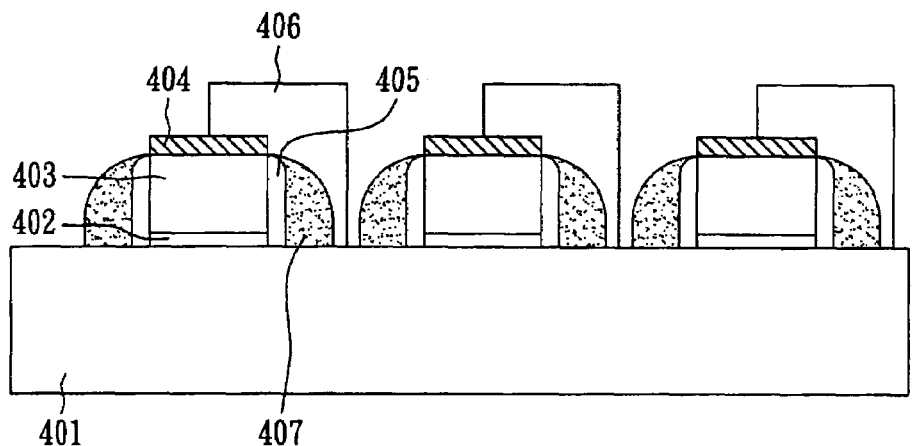
Figure 4C:
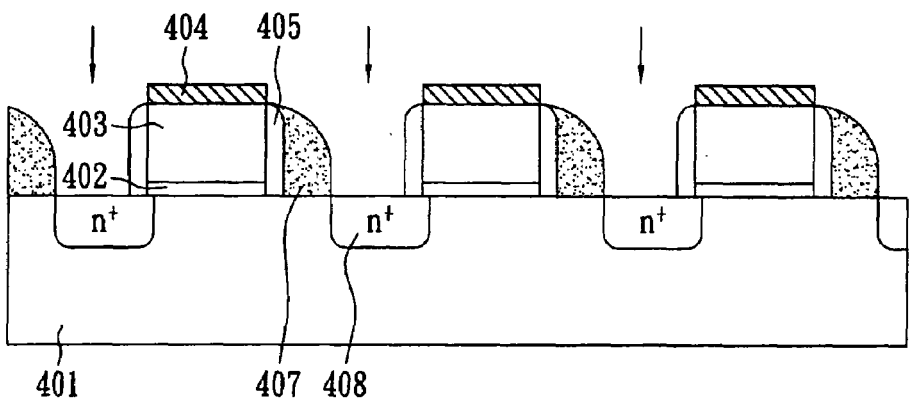
Figure 4D:
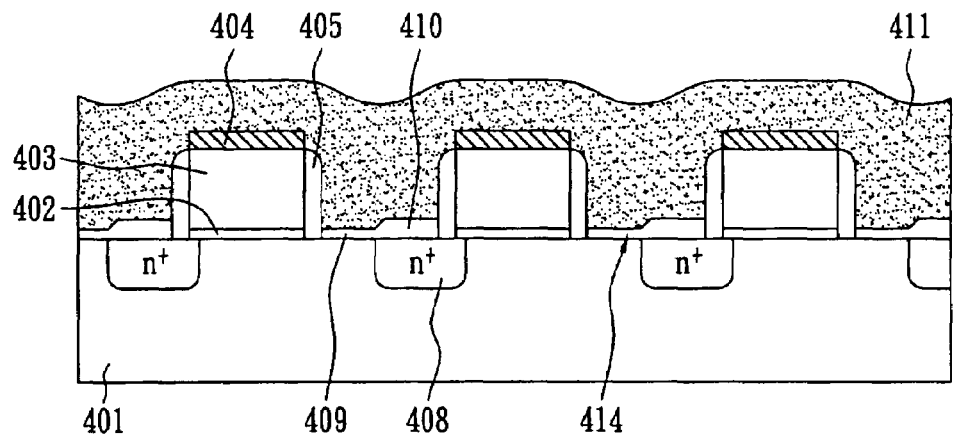
Figure 4E:
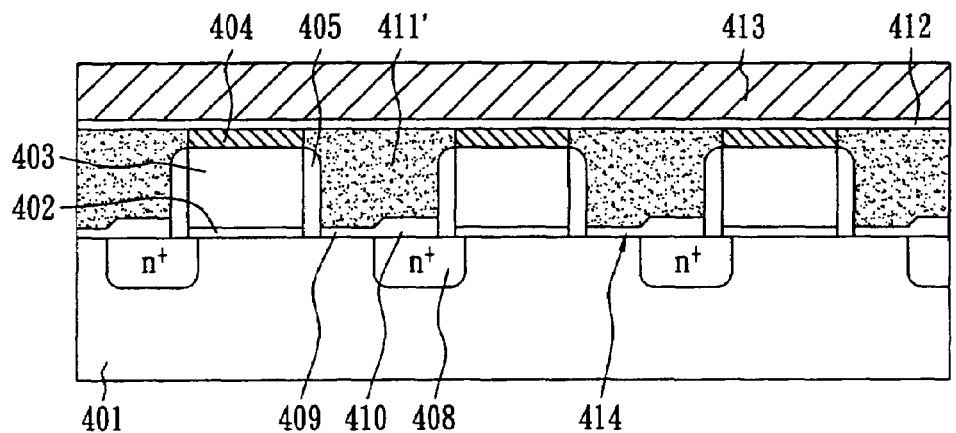
Figure 4F:
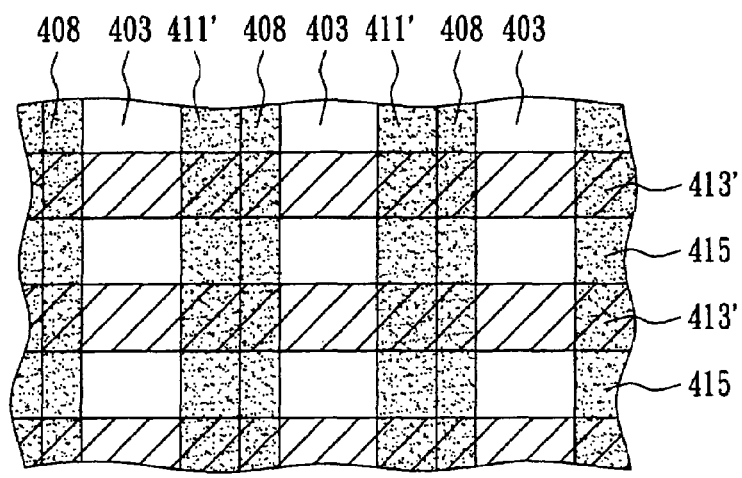

In FIG. 4(a), a gate dielectric layer, a first conductive layer, an insulating layer are sequentially formed on a silicon substrate 401, and patterned to be individual gate structures afterwards. Each gate structure comprises a gate dielectric layer 402, a first conductive line 403 and an insulating layer 404. The first conductive line 403 can be composed of polysilicon, whereas the insulating layer 404 can be a multilayer of silicon nitride and silicon oxide. In FIG. 4(b), dielectric spacers 405 ranging from 100 to 300 angstroms and mask spacers 407, e.g., silicon nitride spacers, ranging from 200 to 800 angstroms are sequentially formed beside the first conductive lines 403. Then, photoresist is deposited and patterned as multiple photoresist caps 406 to cover one side mask spacer 407 of each first conductive line 403, and in consequence, as shown in FIG. 4(c), the uncovered nitride spacers 407 will be stripped away while being dipped in hot phosphoric acid afterwards, and the photoresist caps 406 are removed afterwards. Dopants such as arsenic ions are implanted with an energy between $5 \times 10^{14}$ and $5 \times 10^{15}$ atoms/cm$^2$ into the substrate 401 to form doping regions 408 serving as bitlines. In FIG. 4(d), the remaining nitride spacers 407 are dipped away, and then first dielectric layers 414 comprising tunnel oxides 409 and silicon oxide layers 410 are formed by thermal growth. Because the growth rate of oxide on doped silicon is faster than that of undoped one, the oxide layer 410 is thicker than the tunnel oxide layer 409. For example, the thickness of the layer 409 is in the range between 100 to 300 angstroms, whereas the thickness of the layer 410 is in the range between 200 to 600 angstroms. It is intended to ensure that the tunneling effect occurs through the tunnel oxide layer 409 rather than the layer 410. Optionally, if the oxide layer 410 is not thick enough or the thickness ratio of the layers 410 and 409 fails to meet the criteria, the first dielectric layer 414 can be partially etched away and grown again to be of the desired thickness. Sequentially, a second conductive layer 411, e.g., a polysilicon layer, is deposited. In FIG. 4(e), the second conductive layer 411 is planarized to be separated second conductive lines 411', followed by forming an ONO layer 412 and a third conductive layer 413 sequentially. FIG. 4(f) illustrates the top view of the memory array described above, in which the third conductive layer 413 is etched to be separated third conductive lines 413' serving as wordlines, and oxide layers 415 are formed therebetween for insulation. The third conductive lines 413' are perpendicular to the two doping regions 408. Accordingly, the first and second conductive lines 403 and 411' function as a select gate and a floating gate respectively.

Figure 4G:
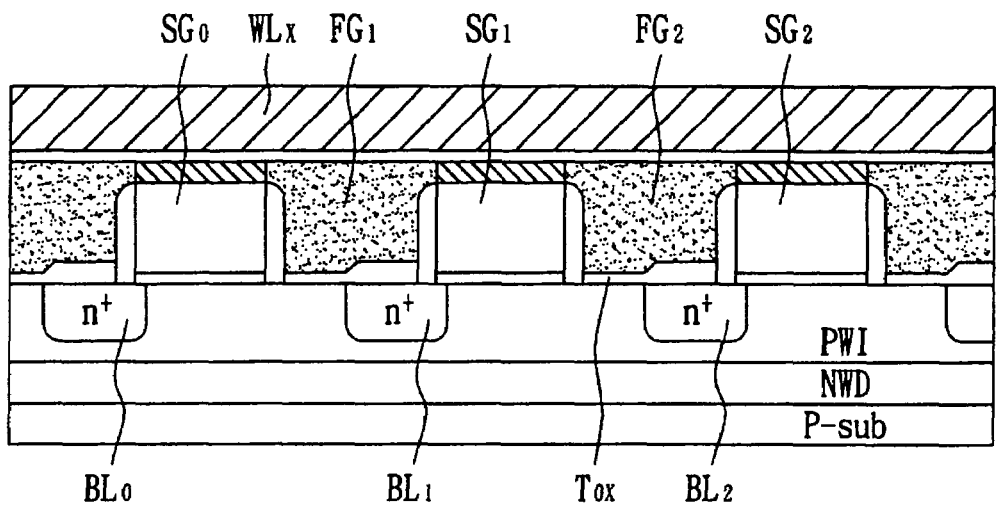
FIG. 4(g) illustrates the schematic diagram with reference to the memory cells as shown in FIG. 4(e) in accordance with the present invention.
Figure 4G:
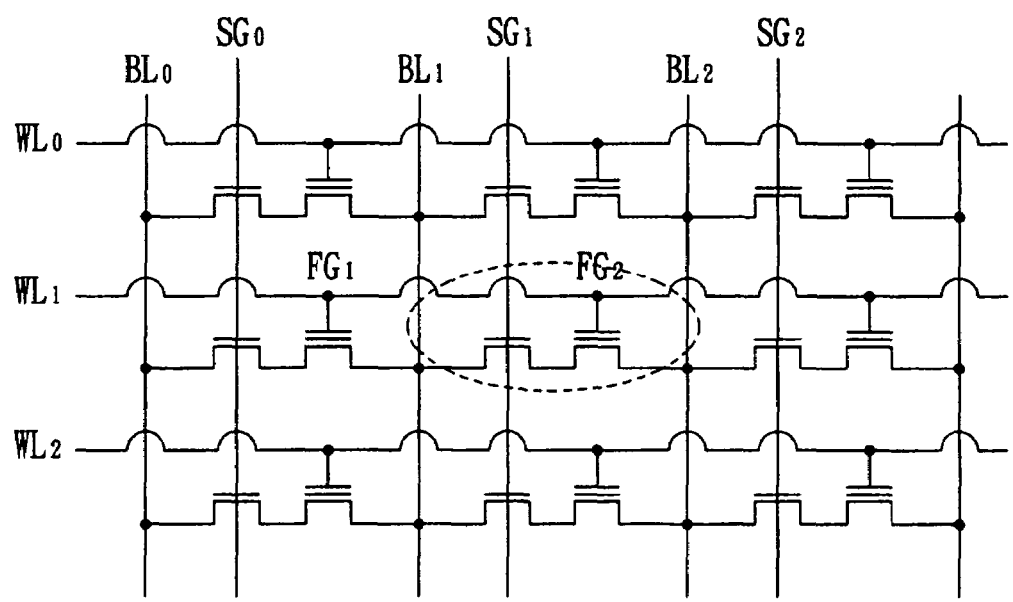

FIG. 4(g) illustrates a schematic diagram with reference to the split gate memory array of the first embodiment put forth in the present invention, in which the memory cell architecture is the same as that shown in FIG. 4(e) but some components are renamed by their functionality, where a wordline is denoted by WL, a bitline is denoted by BL, a select gate is denoted by SG, a floating gate is denoted by FG, and a tunnel oxide layer is denoted by Tox. Moreover, PWI and NWD wells are formed in the P-substrate. Examples for reading, programming and erasing the memory cell $WL_1$, $BL_1$, $BL_2$, i.e., the one with dash line circle in FIG. 4(g), are shown in Table 1.

TABLE 1

| | $WL_0$ | $WL_1$ | $WL_2$ | $SG_0$ | $SG_1$ | $SG_2$ | $BL_0$ | $BL_1$ | $BL_2$ | $BL_3$ | PWI | NWD | P-sub |
|---|---|---|---|---|---|---|---|---|---|---|---|---|---|
| Program | 0 V | 12 V | 0 V | 0 V | −5 V | −5 V | 0 V | 0 V | −5 V | 0 V | −5 V | 0.3 V | 0 V |
| Page erase | 0 V | −18 V | 0 V | 0 V | 0 V | 0 V | 0 V | 0 V | 0 V | 0 V | 0 V | 0 V | 0 V |
| Bit/byte erase | 0 V | −12 V | 0 V | 0 V | 0 V | 5 V | 0 V | 0 V | 0 V | 0 V | 0 V | 0 V | 0 V |
| Read | 0 V | 5 V | 0 V | 0 V | 3–5 V | 0 V | 0 V | 1–2 V | 0 V | 0 V | 0 V | 0 V | 0 V |

For programming, 12V is applied to $WL_1$, and −5V is applied to $BL_2$, thereby an effective high voltage bias is generated across the tunnel oxide layer Tox, so that electron can be injected into the floating gate $FG_2$, i.e., F-N programming occurs. In order to prevent bias voltage generation on the right hand side of the $BL_2$, −5V or more negative voltage is applied to $SG_1$ and $SG_2$. Similarly, −5V is applied to PWI for the same reason. In other words, the voltage applied on the select gate next to the selected bitline is equal to or more negative in comparison with the bitline voltage, so that the select gate and the bitline are kept at equal potential to avoid that bitline voltage is transferred to another memory cell. Further, 0.3V is applied to NWD, and P-substrate is grounded, such that reverse bias occurs between PWI and NWD, and so occurs between NWD and P-sub.

For page erasure, i.e., erasing all the memory cells of a wordline, a high voltage such as −18V is applied to $WL_1$ so as to erase all the memory cells of $WL_1$ at the same time.

For bit/byte erasure, a relatively low voltage compared to that for page erasure such as −12V is applied to $WL_1$, and such voltage cannot expel electrons out of the floating gates. In addition, 5V is applied to $SG_2$, and is associated with −12V to generate sufficient bias voltage for F-N tunneling erasure in respect of the cell $FG_2$.

For reading, $WL_1$ and $SG_1$ and $BL_1$ are 5V, 3–5V and 1–2V, respectively. Accordingly, no current occurs if the $FG_2$ is programmed, and, in contrast, current occurs if the $FG_2$ is not programmed.

FIGS. 5(a) through 5(f) illustrate a process for forming split gate memory cells of the second embodiment in accordance with the present invention.

Figure 5A:
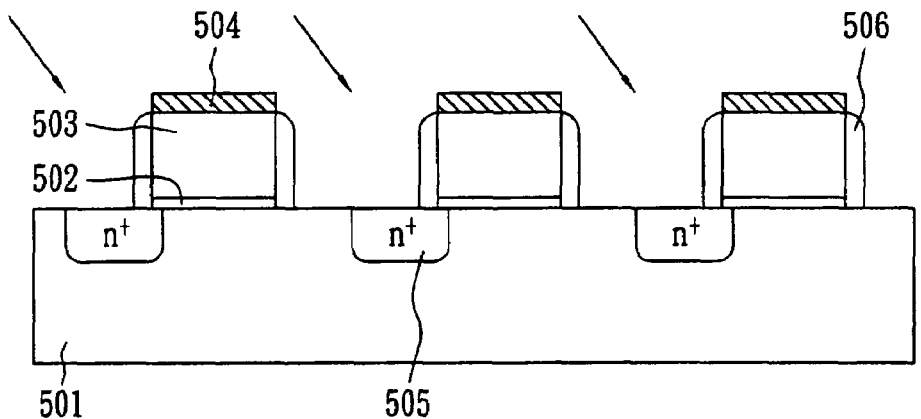
FIGS. 5(a) through 5(f) illustrate the method for manufacturing split gate memory cells of the second embodiment in accordance with the present invention.
Figure 5B:
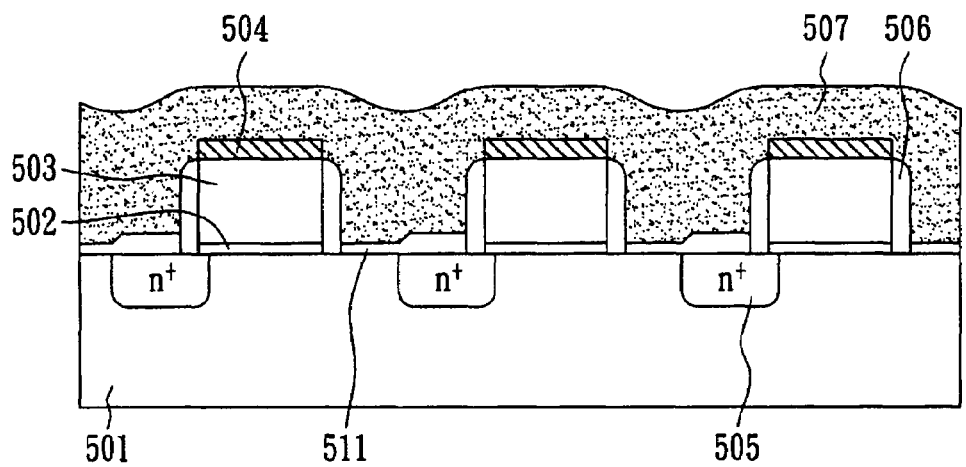
Figure 5C:
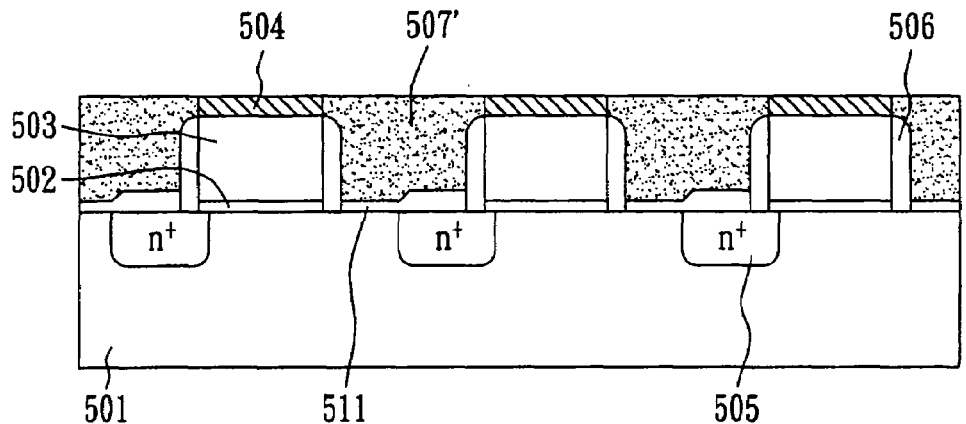
Figure 5D:
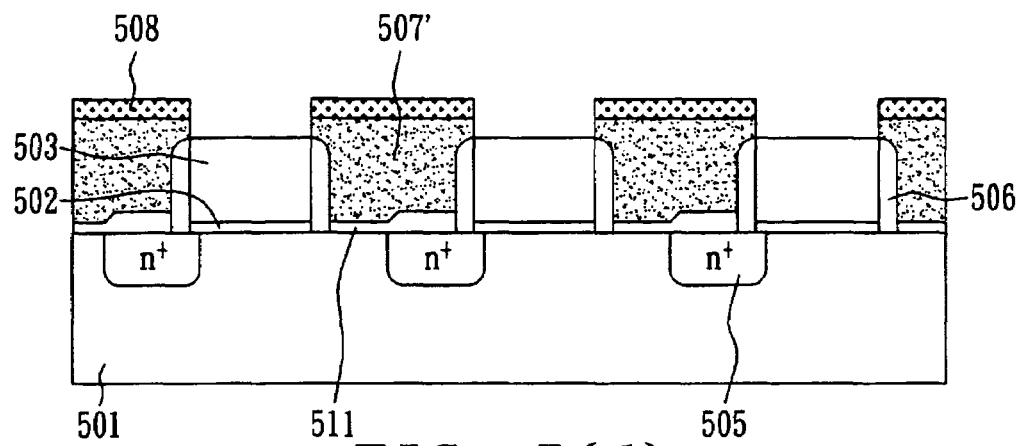
Figure 5E:
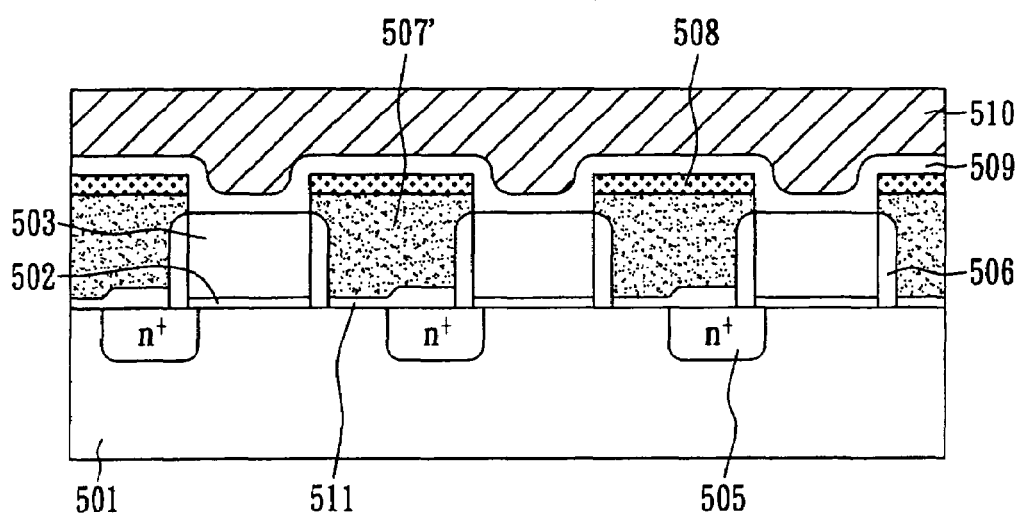
Figure 5F:
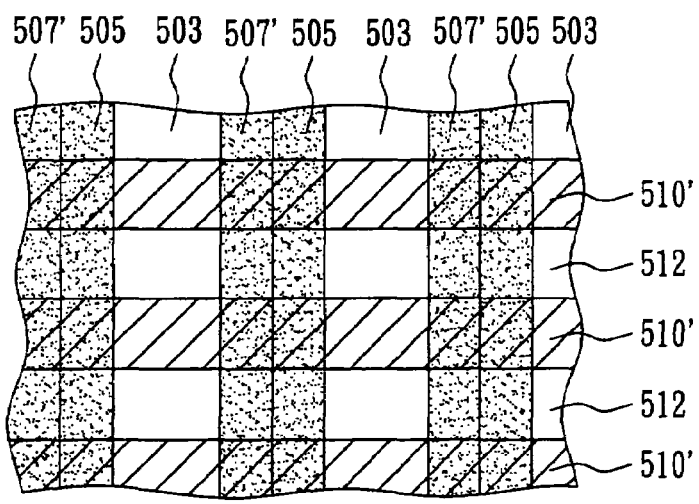

In FIG. 5(a), a gate dielectric layer, a first conductive layer and a silicon nitride layer are sequentially formed on a semiconductor substrate 501, and are patterned to be separated gate structures. The gate structure comprises a gate dielectric layer 502, a first conductive line 503 and a silicon nitride layer 504, where the gate dielectric layer 502 is in the range of 70 to 150 angstroms, the first conductive line 503 is in the range of 400 to 2000 angstroms, and the silicon nitride layer 504 is in the range of 500 to 2000 angstroms. Then, dielectric spacers 506 ranging from 100 to 300 angstroms are formed beside the two sides of the first conductive line 503, and followed by tilt-implanting dopants such as arsenic ions with an energy between $5 \times 10^{14}$ and $5 \times 10^{15}$ atoms/cm$^2$, so as to form doping regions 505 serving as bitlines. In FIG. 5(b), a dielectric layer 511 is formed on the substrate 501, followed by depositing a conductive layer 507. In FIG. 5(c), the conductive layer 507 is planarized to be second conductive lines 507'. In FIG. 5(d), the silicon nitride layers 504 are removed by, for example, hot phosphoric acid, and then insulating layers 508 such as oxide layers ranging from 800 to 2000 angstroms are formed on the second conductive line 507' by either thermal growth or deposition. In FIG. 5(e), a second dielectric layer 509, e.g., an ONO layer, and a third conductive layer 510 are formed in order. In FIG. 5(f), illustrating the top view of the memory array, the third conductive layer 510 is patterned to be separated third conductive lines 510' serving as wordlines, and oxide layers 512 are formed therebetween for insulation. The third conductive lines 510' are substantially perpendicular to the two doping regions 505. Accordingly, the first and second conductive lines 503 and 507' function as a floating gate and a select gate, respectively.

Figure 5G:
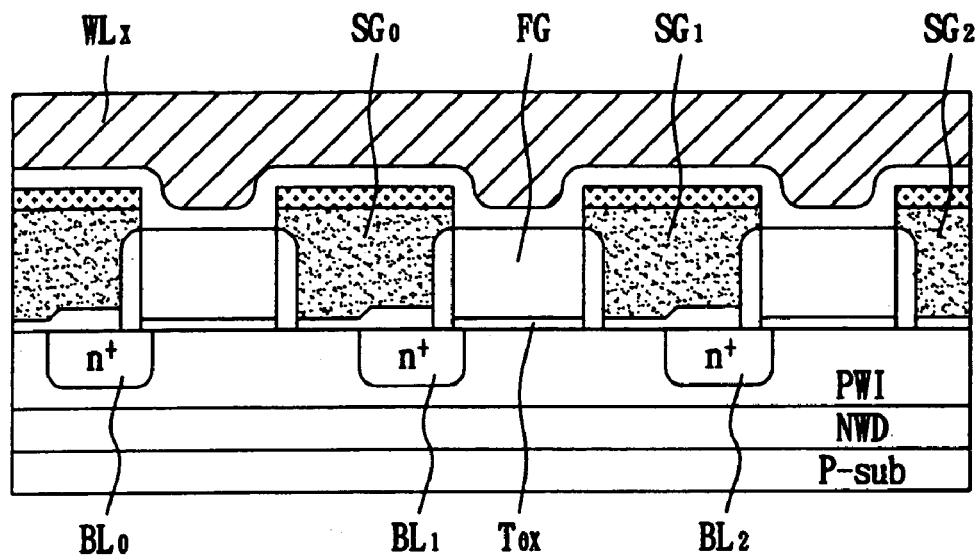
FIG. 5(g) illustrates the schematic diagram with reference to the memory cells as shown in FIG. 5(e) in accordance with the present invention.
Figure 5G:
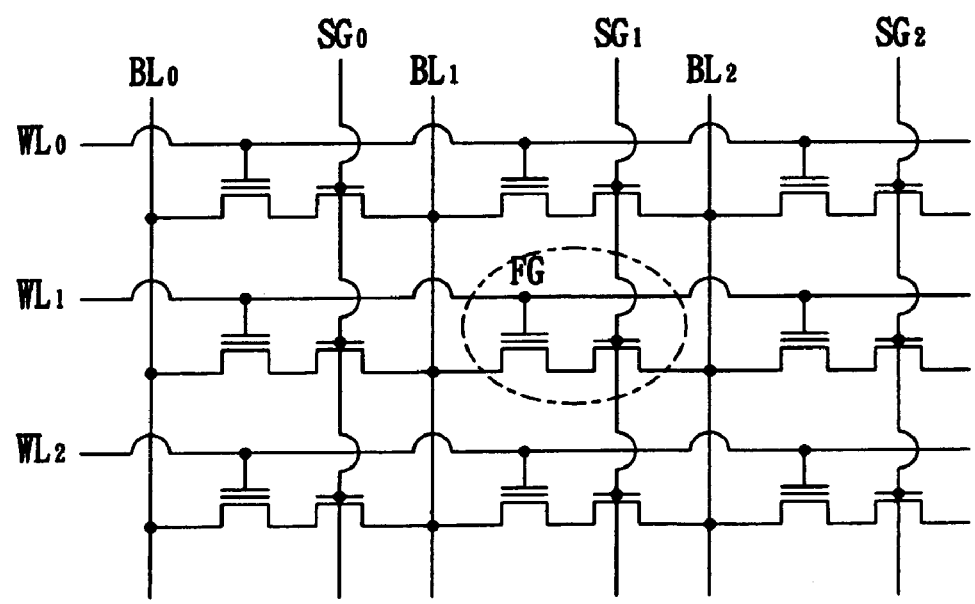

FIG. 5(g) illustrates a schematic diagram with reference to the split gate memory array of the second embodiment set forth in the present invention, in which the memory cell architecture is the same as that shown in FIG. 5(e) but some components are renamed according to their functionality as mentioned in the first embodiment. The memory structure shown in FIG. 5(g) is quite similar to that shown in FIG. 4(g) except positions of select gate and floating gate are interchanged. An example for programming the memory cell $WL_1$, $BL_1$, $BL_2$, i.e., the one with dash line circle in FIG. 5(g), is shown in Table 2. Because the erasure and reading for memory cells are essentially equivalent to that mentioned in the first embodiment, they are omitted herein.

TABLE 2

|  | $WL_0$ | $WL_1$ | $WL_2$ | $SG_0$ | $SG_1$ | $SG_2$ | $BL_0$ | $BL_1$ | $BL_2$ | PWI | NWD | P-sub |
|---|---|---|---|---|---|---|---|---|---|---|---|---|
| Program | 0 V | 12 V | 0 V | −5 V | −5 V | 0 V | 0 V | −5 V | 0 V | −5 V | 0.3 V | 0 V |

For programming, 12V is applied to $WL_1$, and −5V is applied to $BL_1$, thereby an effective high voltage bias is generated across the tunnel oxide layer Tox, so that electron can be injected into the floating gate FG, i.e., F-N programming occurs. In order to prevent bias voltage generation on the left hand side of the $BL_1$, −5V or more negative voltage is applied to $SG_0$ and $SG_1$. Similarly, −5V is applied to PWI for the same reason. In other words, the voltage applied on the select gate next to the selected bitline is equal to or more negative voltage in comparison with the bitline voltage, so that the select transistor and the bitline are kept at equal potential to avoid the bitline voltage transfers to another memory cell. Further, 0.3V is applied to NWD, and P-substrate is grounded, such that reverse bias occurs between PWI and NWD, and so occurs between NWD and P-sub.

In addition to the application to a non-volatile memory cell of NMOS type as the above mentioned, a memory cell of PMOS type can also be implemented without departing from the spirit of the present invention.

The above-described embodiments of the present invention are intended to be illustrative only. Numerous alternative embodiments may be devised by those skilled in the art without departing from the scope of the following claims.

What is claimed is:

1. A method for programming a split gate memory cell, comprising the steps of:
   providing a split gate memory cell formed on a semiconductor substrate of a first conductive type and having two bitlines of a second conductive type, a first select gate, a floating gate, a wordline and a dielectric layer between the floating gate and the semiconductor substrate, wherein the first select gate and floating gate are transversely disposed between the two bitlines, the wordline is above the first select gate and floating gate, the semiconductor substrate comprises a first well of the first conductive type and a second well of the second conductive type, the two bitlines are formed within the first well, and the first well is surrounded by the second well;
   applying a positive voltage to the wordline so as to turn on the floating gate; and
   applying a negative voltage to the bitline next to the floating gate;
   whereby a bias voltage across the dielectric layer is generated for programming.

2. The method for programming a split gate memory cell in accordance with claim 1, further comprising the step of applying a negative voltage to a second select gate next to the floating gate.

3. The method for programming a split gate memory cell in accordance with claim 2, wherein the absolute value of the negative voltage applied to the second select gate is equal to or larger than that of the negative voltage applied to the bitline next to the floating gate.

4. The method for programming a split gate memory cell in accordance with claim 1, wherein a negative voltage and a positive voltage are applied to the first well and the second well respectively, the absolute value of the negative voltage applied to the first well is equal to or larger than that of the negative voltage applied to the bitline next to the floating gate, and the semiconductor substrate is grounded.

5. The method for programming a split gate memory cell in accordance with claim 1, wherein the dielectric layer is partially formed on the bitline next to the floating gate.

6. The method for programming a split gate memory cell in accordance with claim 5, wherein the portion of the dielectric layer on the bitline next to the floating gate is thicker than that on the semiconductor substrate.

* * * * *